United States Patent [19]

Bergemont et al.

[11] Patent Number: 5,587,949

[45] Date of Patent: Dec. 24, 1996

[54] METHOD FOR PROGRAMMING AN ETOX EPROM OR FLASH MEMORY WHEN CELLS OF THE ARRAY ARE FORMED TO STORE MULTIPLE BITS OF DATA

[75] Inventors: Albert Bergemont; Min-hwa Chi, both of Palo Alto, Calif.

[73] Assignee: National Semiconductor Corporation, Santa Clara, Calif.

[21] Appl. No.: 429,644

[22] Filed: Apr. 27, 1995

[51] Int. Cl.$^6$ .................................................. G11C 13/00
[52] U.S. Cl. ..................... 365/185.24; 365/168; 365/184; 365/185.03
[58] Field of Search .......................... 365/185.03, 185.24, 365/168, 184, 185.29, 218

[56] References Cited

U.S. PATENT DOCUMENTS

| 4,181,980 | 1/1980 | McCoy | 365/45 |
|---|---|---|---|
| 4,279,024 | 7/1981 | Schrenk | 365/203 |
| 4,357,685 | 11/1982 | Daniele et al. | 365/189 |
| 4,698,787 | 10/1987 | Mukherjee et al. | 365/185 |
| 5,021,999 | 6/1991 | Kohda et al. | 365/168 |
| 5,043,940 | 8/1991 | Harari | 365/168 |
| 5,187,683 | 2/1993 | Gill | 365/185 |
| 5,204,835 | 4/1993 | Eitan | 365/185 |
| 5,319,593 | 6/1994 | Wolstenholme | 365/185.24 X |
| 5,346,842 | 9/1994 | Bergemont | 437/52 |
| 5,394,362 | 2/1995 | Banks | 365/189.01 |
| 5,416,738 | 5/1995 | Shrivastava | 365/185.24 |
| 5,418,743 | 5/1995 | Tomioka et al. | 365/189.01 |
| 5,440,505 | 8/1995 | Fazio et al. | 365/45 |
| 5,477,485 | 12/1995 | Bergemont et al. | 365/185.24 |
| 5,511,021 | 4/1996 | Bergemont et al. | 365/185.03 |

OTHER PUBLICATIONS

T. Blyth et al., "A Non–Volatile Analog Storage Device Using EEPROM Technology", ISSCC91/Session 11/Emerging Circuit Technologies/Paper TP11.7, Feb. 14, 1991 (3 Pages).

M. Horiguchi et al., "An Experimental Large–Capacity Semiconductor File Memory Using 16–Levels/Cell Storage", IEEE Journal of Solid–State Circuits, vol. 23, No. 1, Feb. 1988, pp. 27–33.

C. Bleiker et al. "A Four–State EEPROM Using Floating–Gate Memory Cells", IEEE Journal of Solid–State Circuits, vol. SC–22, No. 3, Jun. 1987, pp. 460–463.

N. Saks et al., "Observation of Hot–Hole Injection of NMOS Transistors Using a Modified Floating–Gate Technique", U.S. Government Publication (5 pages).

K. Oyama et al., "A Novel Erasing Technology for 3.3V Flash Memory with 64Mb Capacity and Beyond", 1992 IEEE, IEDM 92, pp. 607–610.

S. Yamada et al., "A Self–Convergence Erasing Scheme for a Simple Stacked Gate Flash EEPROM", 1991 IEEE, IEDM 91, pp. 307–310.

E. Takeda et al., "Device Performance Degradation Due to Hot–Carrier Injection at Energies Below the Si–SiO$_2$ Energy Barrier", 1983 IEEE, IEDM 83, pp. 396–399.

K. R. Hofmann et al., "Hot–Electron and Hole–Emission Effects in Short n–Channel MOSFET's", IEEE Transactions on Electron Devices, vol. ED–32, No. 3, Mar. 1985, pp. 691–699.

(List continued on next page.)

Primary Examiner—Do Hyun Yoo
Attorney, Agent, or Firm—Limbach & Limbach L.L.P.

[57] ABSTRACT

Multiple logic levels can be simultaneously programmed into any combination of memory cells in a column of an ETOX array by applying one of a corresponding number of programming voltages to the word lines that correspond with the cells to be programmed. In the present invention, the memory cells in the array form a punchthrough current during programming which, in turn, leads to the formation of an increased number of substrate hot electrons. By utilizing the substrate hot electrons formed from the punchthrough current in addition to the channel hot electrons, much lower control gate voltages can be utilized during programming.

20 Claims, 6 Drawing Sheets

OTHER PUBLICATIONS

Y. Nissan–Cohen, "A Novel Floating–Gate Method for Measurement of Ultra–Low Hole and Electron Gate Currents in MOS Transistors", IEEE Electron Device Letters, vol. EDL–7, No. 10, Oct. 1986, pp. 561–563.

R. Bez et al., "A Novel Method for the Experimental Determination of the Coupling Ratios in Submicron EPROM and Flash EEPROM Cells", 1990 IEEE, IEDM 90, pp. 99–102.

Myrvaagnes, R., Will flash memory hold multiple bits/cell?, Outlook, *Electronic Products,* Sep. 1994, p. 20.

METHOD FOR PROGRAMMING AN ETOX EPROM OR FLASH MEMORY WHEN CELLS OF THE ARRAY ARE FORMED TO STORE MULTIPLE BITS OF DATA

BACKGROUND OF THE INVENTION

1. Field of the Invention

The present invention relates to programming an ETOX FLASH or EPROM memory and, more particularly, to a method for programming these memories when cells of the array are formed to store multiple bits of data, i.e., more than a logic "1" and a logic "0".

2. Description of the Related Art

An ETOX array architecture is a type of nonvolatile memory architecture that is characterized by a metal drain line that contacts each drain region in a column of drain regions. The ETOX architecture can be utilized with both U-V erasable EPROMs as well as flash memories.

FIG. 1 shows a portion of a conventional ETOX array 10. As shown in FIG. 1, array 10 includes a plurality of field oxide regions FOX which are arranged in columns and rows, and a series of common source bit lines CSBL1–CSBLm which are arranged so that one row of field oxide regions FOX is formed between each pair of adjacent common source bit lines CSBL1–CSBLm.

A plurality of memory cells 12 and drain regions 14 are also arranged in columns and rows so that a pair of memory cells 12 are formed between each pair of horizontally-adjacent field oxide regions FOX, and so that a drain region 14 is formed between each pair of memory cells 12 that are formed between each pair of horizontally-adjacent field oxide regions FOX.

Array 10 further includes a series of word lines WL1–WLn which are arranged so that one word line WL is formed over each of the memory cells 12 in a row of memory cells 12. As is well known, the portion of the word line WL which is formed over each memory cell 12 functions as the control gate of that memory cell 12.

In addition, a series of metal drain lines MDL1–MDLs are formed so that each metal drain line MDL contacts each of the drain regions 14 in a corresponding column of drain regions 14.

A cell 12 in array 10 is conventionally programmed to store one bit of data by applying an intermediate voltage to the metal drain line MDL that contacts the cell 12 to be programmed, grounding the common source bit lines CSBL1–CSBLm, and applying a programming voltage to the word line WL that corresponds with the cell 12 to be programmed.

For example, to program cell A, an intermediate voltage (approximately 5–7 V) is applied to metal drain line MDL1, while the common source bit lines CSBL1–CSBLm are held at ground. The remaining metal drain lines MDLs are allowed to float or are grounded.

The programming voltage (approximately 12 V) is applied to word line WL1, while the remaining word lines WL2–WLn are grounded. These bias conditions, in turn, cause electrons to be injected from common source bit line CSBL1 to the floating gate of cell A, thus programming cell A.

One drawback to programming memory cells 12 as described above is that only one cell in a column of cells can be programmed at any one time. Although it would appear that multiple cells in a column could be simultaneously programmed by applying the programming voltage to the word lines WL2–WLn that correspond to each cell in the column to be programmed, the high current requirements of each cell during programming (approximately 400 mA) preclude this. Thus, there is a need for a method of programming multiple cells in a column of an ETOX array at the same time.

SUMMARY OF THE INVENTION

The present invention provides a method for simultaneously programming any combination of memory cells in a column of cells of an ETOX array to each store one of three or more threshold voltages, i.e., logic levels. As a result, rather than storing either a logic "1" or a logic "0" any combination of memory cells in a column can be simultaneously programmed to store, for example, a logic "0-0", a "0-1", a "1-0", or a "1-1".

In the present invention, the array, which is formed in a well, includes a plurality of memory cells formed in columns and rows, and a plurality of common source bit lines arranged so that two rows of memory cells are formed between each pair of adjacent common source bit lines. In addition, a plurality of drain regions are arranged in columns and rows so that one row of drain regions is formed between each pair of adjacent common source bit lines, and so that one drain region is formed between every other pair of memory cells in each column of memory cells. The array further includes a plurality of word lines and a plurality of metal bit lines. The word lines are arranged so that one word line is formed over each of the memory cells in a row of memory cells, while the metal drain lines are formed so that one metal drain line contacts each of the drain regions in a column of drain regions. In addition, each cell of the array is formed to produce a punchthrough current during programming.

A method for simultaneously programming any combination of memory cells in a column to each store one of three or more threshold voltages includes the step of selecting a programming voltage from three or more programming voltages for each of a plurality of cells in a column of cells that are to be programmed. In the present invention, the three or more programming voltages correspond to the three or more threshold voltages. In addition, each cell in the column that is to be programmed has a corresponding word line.

The method continues with the step of applying a first voltage to the metal drain line that corresponds to the column of cells to be programmed. In addition to the first voltage, a second voltage, which is less than the first voltage, is applied to the common source bit lines and the well.

Each cell is programmed to store one of the multiple logic levels by applying the programming voltages selected for the cells to be programmed to the word lines that correspond to the cells to be programmed for a predetermined time.

A better understanding of the features and advantages of the present invention will be obtained by reference to the following detailed description and accompanying drawings which set forth an illustrative embodiment in which the principals of the invention are utilized.

DETAILED DESCRIPTION

Figure 1:
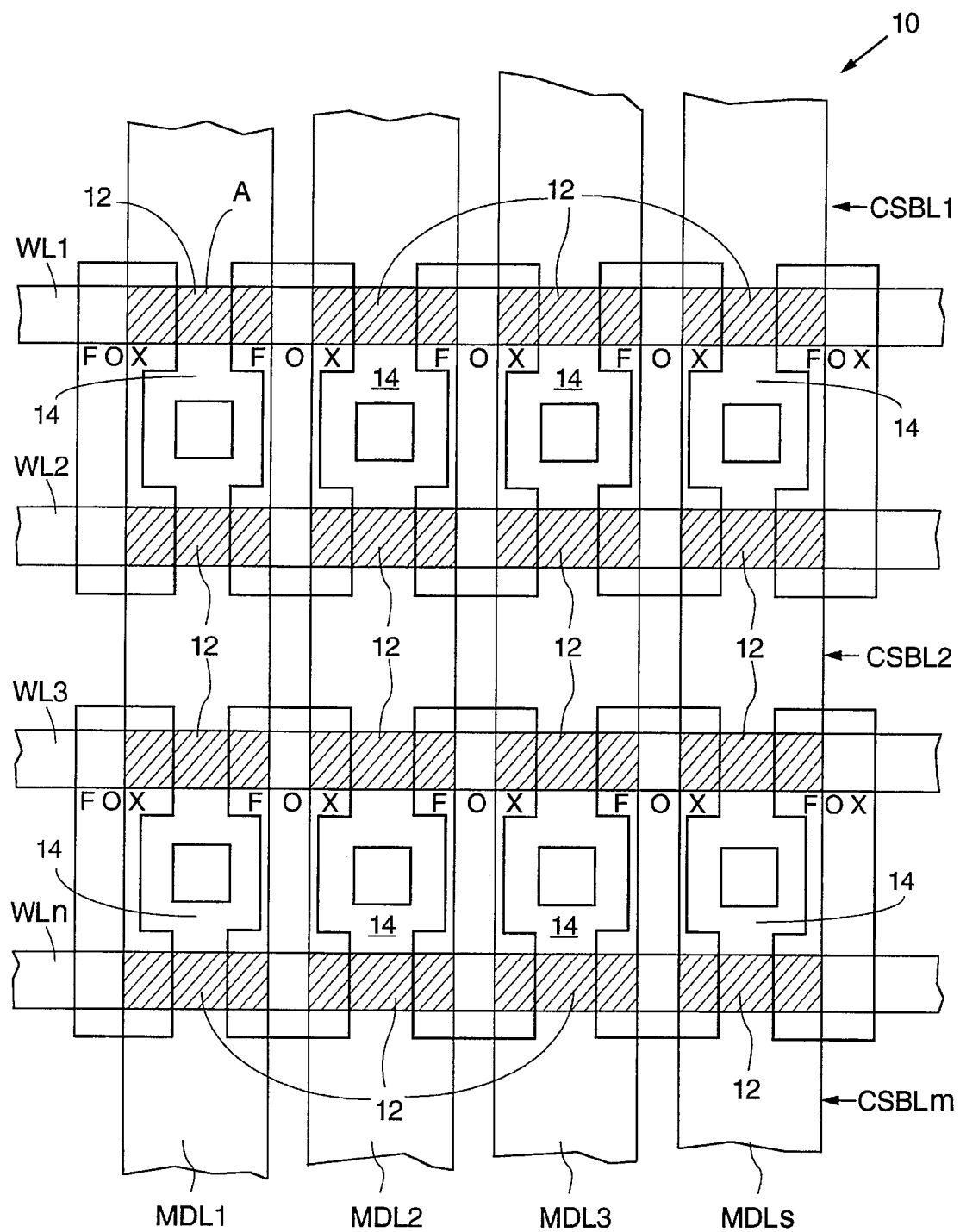
FIG. 1 is a plan view illustrating a portion of a conventional ETOX array 10.
Figure 2:
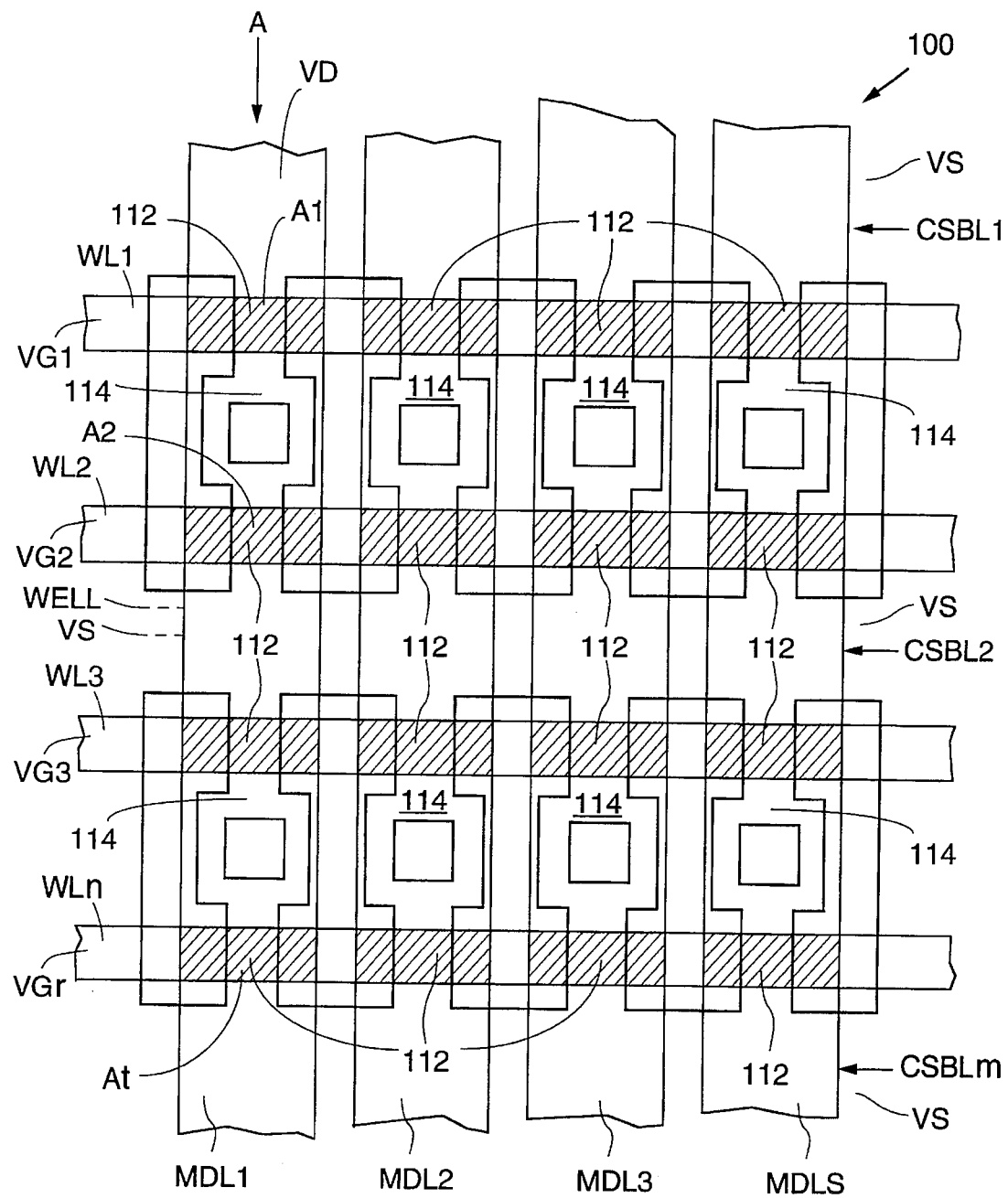
FIG. 2 is a plan view illustrating a portion of an ETOX array 100 in accordance with the present invention.

FIG. 2 shows a portion of an ETOX array 100 in accordance with the present invention. As shown in FIG. 2, array 100, which is formed in a well, includes a plurality of memory cells 112 which are formed in columns and rows, and a series of common source bit lines CSBL1–CSBLm which are arranged so that two rows of memory cells 112 are formed between each pair of adjacent common source bit lines CSBL1–CSBLm.

A plurality of drain regions 114 are also arranged in columns and rows so that one row of drain regions 114 is formed between each pair of adjacent common source bit lines CSBL1–CSBLm, and so that one drain region 114 is formed between every other pair of memory cells 112 in each column of memory cells 112.

Array 100 also includes a series of word lines WL1–WLn which are arranged so that one word line WL is formed over each of the memory cells 112 in a row of memory cells 112. Further, a series of metal drain lines MDL1–MDLs are formed so that one metal drain line MDL contacts each of the drain regions 114 in a column of drain regions 114.

Figure 3:
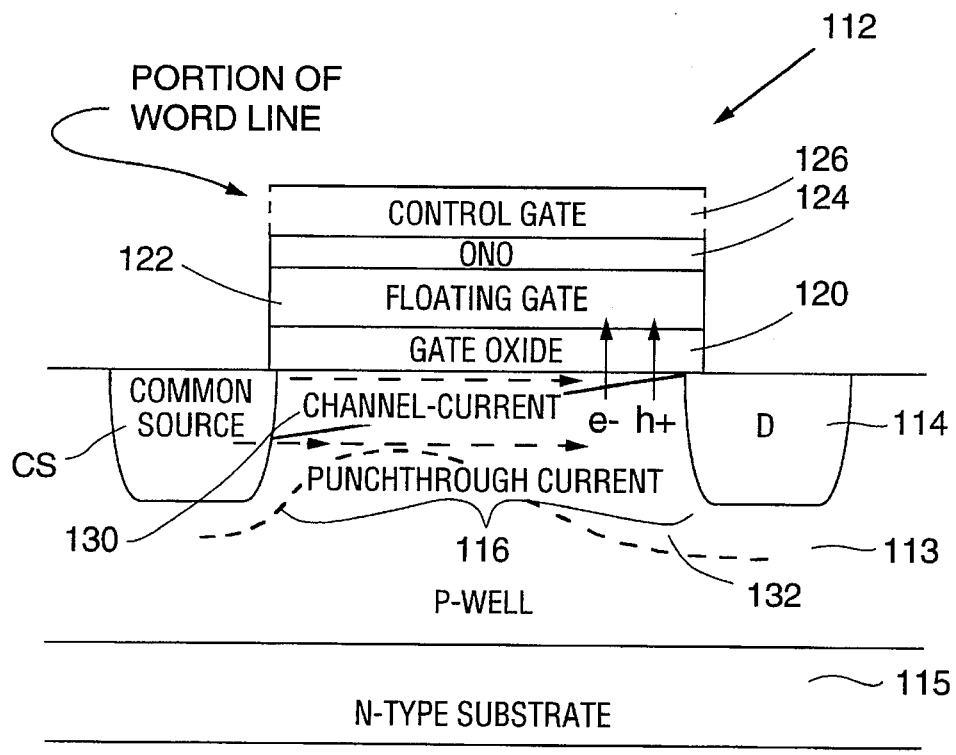
FIG. 3 is a cross-sectional view illustrating the structure of one of the memory cells 112 from array 100.

FIG. 3 shows the structure of one of the memory cells 112 from array 100. As shown in FIG. 3, cell 112 is formed in a p-type well 113 which, in turn, is formed in an n-type substrate 115. Memory cell 112 includes an n-type source region CS, an n-type drain region 114, and a channel region 116 formed between the source and drain regions CS and 114.

In accordance with the present invention, cell 112 is formed to produce a punchthrough current during programming. The channel lengths and doping levels, as well as the bias conditions, which are required to produce a punchthrough current through channel region 116 are well known in the art.

With 0.6 micron technology, for example, cell 112 preferably utilizes a channel length of 0.5–0.7 microns and a doping concentration in the range of $10^{16}$–$10^{17}$ cm$^{-3}$ p-type atoms. When smaller micron technologies are utilized, the channel length and the doping concentration can be adjusted accordingly. Thus, for example, with 0.3 micron technology, cell 112 preferably utilizes a channel length of 0.2–0.4 microns and a doping concentration in the range of $10^{17}$–$10^{18}$ cm$^{-3}$ p-type atoms.

As further shown in FIG. 3, memory cell 112 also includes a first insulation layer 120 formed over channel region 116, a floating gate 122 formed over insulation layer 120, a second insulation layer 124 formed over floating gate 122, and a control gate 126 (a portion of word line WL) formed over insulation layer 124.

In accordance with the present invention, memory cell 112 is programmed to store one of three or more logic levels by maintaining an equilibrium across the source-to-well junction, reverse-biasing the drain-to-well junction, and applying one of a corresponding three or more programming voltages to control gate 126 during programming.

With 0.6 micron technology, memory cell 112 preferably utilizes a drain voltage that is 4–7 volts greater than the well voltage. In addition, although other voltages can be utilized, well 113 and source CS are preferably grounded.

As above, when smaller micron technologies are utilized, the preferred conditions can be reduced accordingly. Thus, for example, with 0.3 micron technology, cell 112 preferably utilizes a drain voltage which is 2–4 volts greater than the well voltage.

In operation, when one of the programming voltages is applied to control gate 126, a positive potential is induced on floating gate 122 which, in turn, attracts electrons from the doped p-type atoms in channel region 116 to the surface of well 113 to form a channel 130. This potential also repels holes from the doped impurity atoms and forms a depletion region 132.

When the source and drain voltages are applied, an electric field is established between the source and drain regions CS and 114. The electric field, as with conventional programming, accelerates the electrons in channel 130 which, in turn, have ionizing collisions that form channel hot electrons. The positive potential on floating gate 122 attracts these channel hot electrons which penetrate insulation layer 120 and begin accumulating on floating gate 122.

In addition to the formation of channel hot electrons, the present invention utilizes the punchthrough current to form substrate hot electrons which also collect on floating gate 122. In operation, due to the relatively short channel length, i.e., 0.5 microns in a 0.6 micron process, the electric field reduces the potential energy barrier at the source-to-well junction. The reduced potential energy barrier allows more majority carriers in source CS to overcome the barrier which, in turn, produces the punchthrough current across the source-to-well junction.

As the electrons associated with the punchthrough current near drain 114, the electric field accelerates the electrons which, in turn, also have ionizing collisions that form substrate hot electrons. The positive potential on floating gate 122 also attracts these substrate hot electrons which penetrate insulation layer 120 and begin accumulating on floating gate 122.

However, unlike conventional floating-gate programming, the flow of electrons associated with the punchthrough current does not depend on the existence of a channel or the relative positive charge on floating gate 122. As a result, the electrons associated with the punchthrough current continue to generate substrate hot electrons which accumulate on floating gate 122 after channel 116 has been turned off.

Thus, cell 112 is programmed by utilizing both channel hot electrons and substrate hot electrons to change the potential on floating gate 122. As a result of utilizing two sources of hot electrons, a significantly lower control gate voltage can be used during programming than is conventionally used to program a cell because fewer channel hot electrons need to be attracted to floating gate 122.

Figure 4:
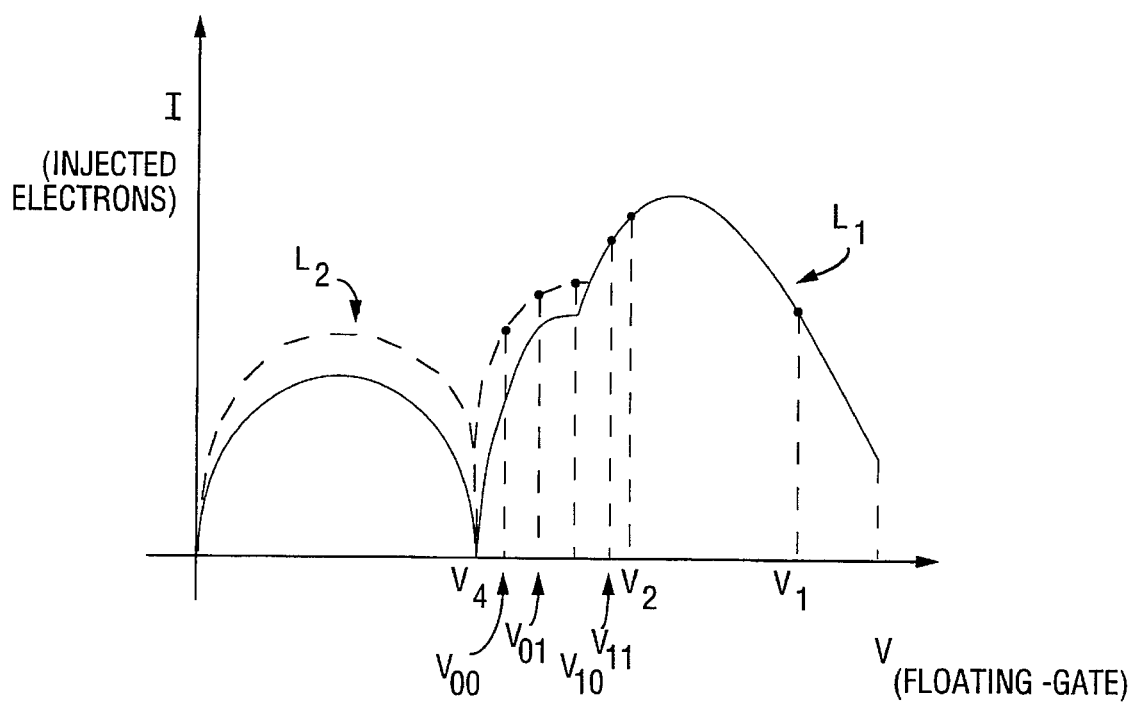
FIG. 4 is a graphical representation illustrating a cell programming characterization curve.

FIG. 4 shows a graphical representation that illustrates a cell programming characterization curve. As shown by lines $L_1$ and $L_2$ in FIG. 4, the voltage (V) on the floating gate influences the number of hot electrons (I) that are injected onto the floating gate.

Conventionally, the primary consideration in programming memory cells is the time required to place a defined amount of negative charge on the floating gate of the cell. As a result, the typical memory cell is designed to utilize an initial floating gate voltage $V_1$ and a final floating gate voltage $V_2$ that are positioned on opposite sides of the peak of the curve shown in FIG. 4, thereby taking advantage of the maximum injection of hot electrons onto the floating gate. As described, the initial floating gate voltage $V_1$ represents the voltage capacitively coupled to the floating gate from the control gate, while the final floating gate voltage $V_2$ represents the initial voltage $V_1$ reduced by the accumulated negative charge.

Figure 5:
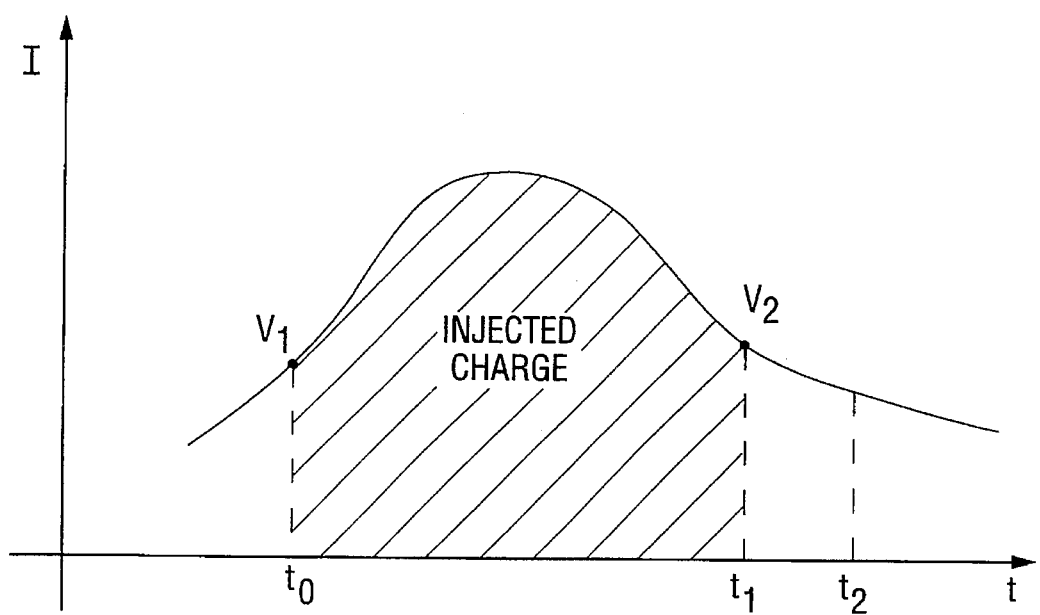
FIG. 5 is a graphical representation illustrating the amount of negative charge injected onto the floating gate for initial and final voltages $V_1$ and $V_2$.

FIG. 5 shows a graphical representation that illustrates the amount of negative charge injected onto the floating gate for initial and final voltages $V_1$ and $V_2$. As shown in FIG. 5, the amount of charge injected on the floating gate can be determined by integrating under the curve from the initial voltage $V_1$ at time $t_0$ to the final voltage $V_2$ at time $t_1$.

More importantly, however, FIG. 5 illustrates that any variation in the timing will cause a greater or lesser amount of negative charge to be injected onto the floating gate. Thus, for example, if the programming is terminated at time $t_2$ rather than time $t_1$, a greater amount of charge will be injected.

With conventional programming, this additional (or lesser) amount of negative charge does not present any problems because the cell is only being programmed to one of two logic levels. Thus, as long as the cell is programmed to have a minimum amount of charge, any additional charge is acceptable.

However, with multi-level programming, the accumulation of additional negative charge makes it difficult to determine which logic level is represented by the charge. Thus, to insure that the charge is within a defined range, the timing must be precisely controlled. This timing, however, is very difficult to control.

The present invention achieves multiple levels of injected charge by utilizing one of a plurality of initial voltages. Since the initial voltages are defined by the voltage capacitively coupled to the floating gate from the control gate, the initial voltages are selected by selecting one of a plurality of control voltages.

For example, referring again to FIG. 4, voltage $V_{00}$, $V_{01}$, $V_{10}$, or $V_{11}$ may be selected as the initial voltage by selecting a corresponding control gate voltage. As further shown in FIG. 4, the present invention utilizes voltage $V_4$ as the final voltage. The significance of utilizing voltage $V_4$ as the final voltage can be seen in FIG. 6.

Figure 6:
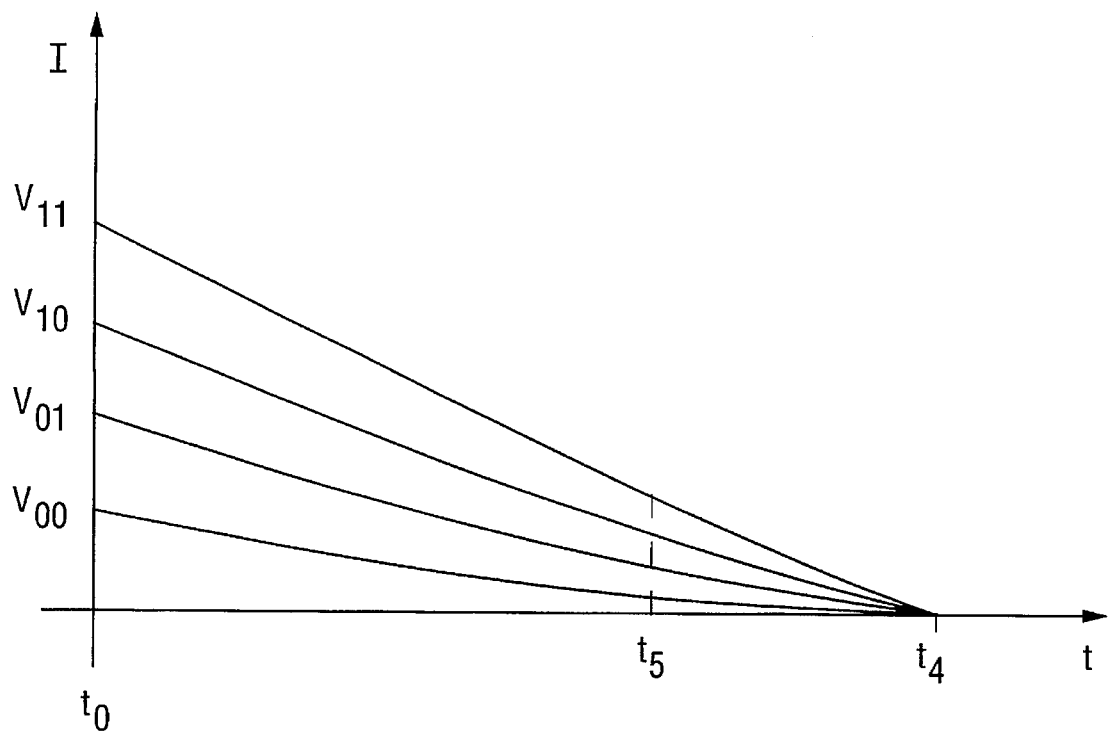
FIG. 6 is a graphical representation illustrating the amount of negative charge injected onto the floating gate for initial voltages $V_{00}$–$V_{11}$ and final voltage $V_4$.

FIG. 6 shows a graphical representation that illustrates the amount of negative charge injected onto the floating gate for initial voltages $V_{00}$–$V_{11}$ and final voltage $V_4$. As shown in FIG. 6, the amount of negative charge injected on the floating gate can be determined by integrating under the curve from each of the initial voltages $V_{00}$–$V_{11}$ at time $t_0$ to the final voltage $V_4$ at time $t_4$.

FIG. 6, however, also illustrates that because the injected charge converges towards zero for each initial voltage $V_{00}$–$V_{11}$, the injected charge is largely insensitive to timing variations. Thus, the floating gate can still have one of a plurality of discrete levels of injected charge if programming is terminated anytime between time $t_4$ and $t_5$ because the amount of additional charge during this time is so small.

One drawback of the approach, as described, is that the magnitude of the injected current drops as the voltage on the floating gate approaches the final voltage $V_4$ (see FIG. 4). As a result, it takes a greater amount of time to program the cell.

In accordance with the present invention, however, line L1 of FIG. 4 can be altered, as shown by line L2, by increasing the formation of substrate hot electrons as described above. Thus, although the time required to program a memory cell in accordance with the present invention remains longer than conventional programming, the formation of substrate hot electrons substantially narrows the time difference.

Figure 7:
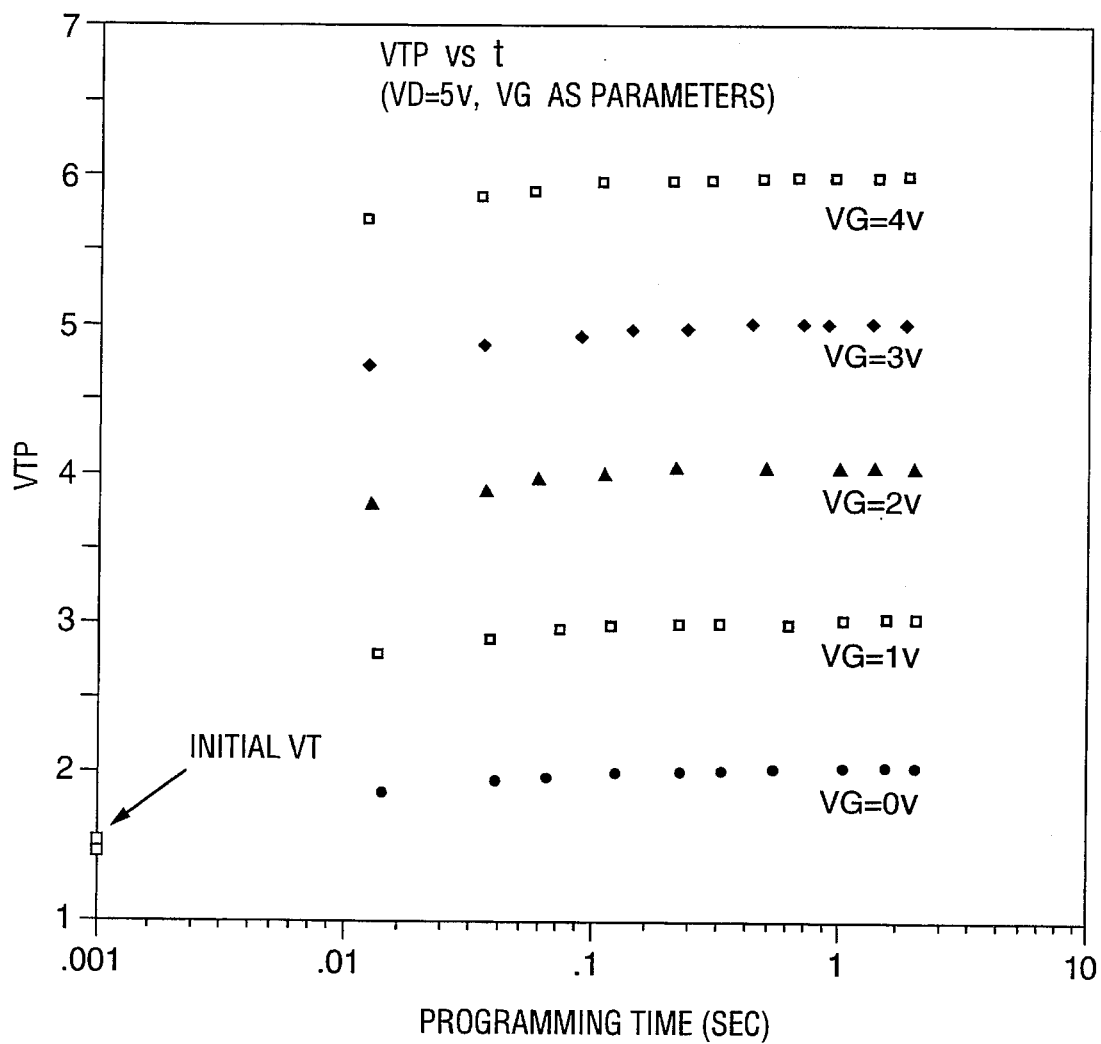
FIG. 7 is a graphical representation illustrating a series of experimental results.

FIG. 7 shows a graphical representation that illustrates a series of experimental results. As shown in FIG. 7, when one volt was applied to the control gate, the charge on the floating gate converged to a threshold voltage of approximately three volts from an initial threshold voltage of 1.5 volts within 50 milliseconds or less. Similarly, when two, three, and four volts were applied to the control gate, the charge on the floating gate converged to threshold voltages of approximately four, five, and six volts, respectively, within 50 milliseconds or less. Although an initial threshold voltage of 1.5 volts was utilized in the above experiment, any initial threshold voltage after erase may be utilized.

Since the charge on the floating gate converges to a stable value which corresponds to a defined threshold voltage within 50 milliseconds or less, a single floating gate memory cell can be programmed to have one of a plurality of threshold voltages by applying the corresponding voltage to the control gate during programming. As a result, a single floating gate memory cell can be utilized to store two or more bits of data.

For example, a 0-0 could be represented by a threshold voltage of 3 volts, while a 0-1 could be represented by a threshold voltage of 4 volts. Similarly, a 1-0 could be represented by a threshold voltage of 5 volts, while a 1-1 could be represented by a threshold voltage of 6 volts.

As further shown in FIG. 7, the experimental results also show that changes in the control gate voltage are linearly related to changes in the threshold voltage, i.e., a one volt increase in the control gate voltage increases the threshold voltage by one volt. As a result, memory cell 112 is not limited to representing two bits, but can represent any number of bits depending on the sensitivity of the current sense detectors utilized to discriminate one threshold voltage from another. Furthermore, even a continuous analog level can be stored in a cell as a threshold voltage.

For example, a 0-0-0 could be represented by a threshold voltage of 3 volts, while a 0-0-1 could be represented by a threshold voltage of 3.5 volts. Similarly, a 0-0-0-0 could be represented by a threshold voltage of 3 volts, while a 0-0-0-1 could be represented by a threshold voltage of 3.25 volts.

Thus, as described above, when an equilibrium condition is maintained across the source-to-well junction, and the drain-to-well junction is reverse-biased, cell 112 can be programmed to store three or more logic levels by applying one of a corresponding three or more programming voltages to the control gate (word line).

The equilibrium and reverse-bias conditions for the cells to be programmed are established in array 100 by identifying the column of cells to be programmed, and applying a voltage VD to the metal drain line MDL that contacts the memory cells 112 in that column.

For example, referring again to FIG. 2, if any combination of cells in column A are to be programmed, voltage VD is applied to metal drain line MDL1. The application of voltage VD to metal drain line MDL1 is equivalent to applying a voltage to the drain of an individual cell as described above. The remaining metal drain lines MDL are allowed to float or, alternately, can be grounded.

In addition to voltage VD, a voltage VS, which is less than voltage VD, is applied to the common source bit lines CSBL1–CSBLm. The application of voltage VS to the common source bit lines CSBL1–CSBLm is equivalent to applying a voltage to the source of an individual cell as described above. The basic bias conditions are completely established by applying voltage VS to the well.

As described above, when 0.6 micron technology is utilized, voltage VD is preferably four to seven volts greater than voltage VS. In addition, voltage VS is preferably ground. When 0.3 micron technology is utilized, voltage VD is preferably 2–4 volts greater than voltage VS.

Programming is accomplished by selecting a programming voltage VG from three or more programming voltages VG1–VGr for each cell to be programmed where the three or more programming voltages correspond to three or more threshold voltages, and by applying the programming voltages VG1–VGr to the word lines WL that correspond to the cells 112 to be programmed for a predetermined time.

For example, if cells A1, A2, and At are to be programmed with voltages VG1, VG2, and VGr, respectively, voltages VG1, VG2, and VGr are simultaneously applied to word lines WL1, WL2, and WLn, respectively. The preferred voltages for programming voltages VG1–VGr depend on the number of logic levels to be programmed and generally fall within 0–5 volts. Although negative voltages can also be used, these voltages are not as desirable because of the additional circuitry needed to generate negative voltages.

In contrast to conventional programming, where the current flowing through a cell is approximately 400 mA, the current flowing through a cell during programming under the present invention is approximately 10 μA. As a result, as shown in FIG. 2, cells A1–At, or any combination thereof in column A, can be programmed at the same time to each have any one of the three or more logic levels by applying the corresponding programming voltages VG1–VGr to the corresponding word lines WL1–WLn.

One of the principle advantages of being able to program an entire column at the same time is that each cell in the array can be programmed to store multiple bits of data in less time than is required for each cell to be conventionally programmed to store one bit of data. For example, in an array that is eight bits wide by 32 bytes long, it takes one programming cycle to conventionally program each cell for a total of 256 (8×32) programming cycles.

On the other hand, since an entire column can be programmed at the same time, only eight programming cycles are required to program the array in accordance with the present invention. Thus, in applications where the entire array is frequently rewritten, the present invention provides a faster overall programming speed than is conventionally available.

Figure 8:
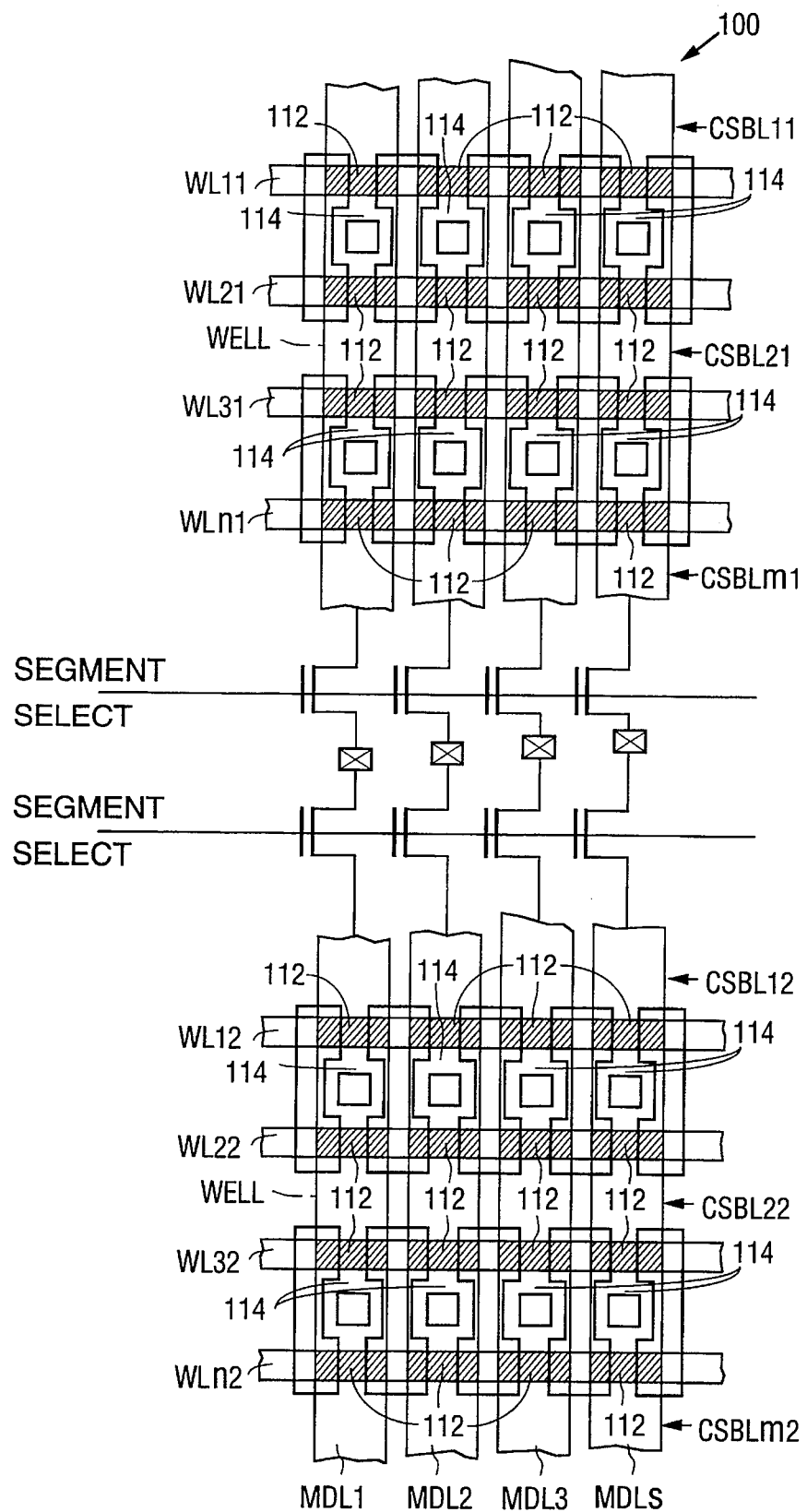
FIG. 8 is a plan view illustrating segment select transistors in a portion of an ETOX array 100 in accordance with the present invention.

In the array illustrated in FIG. 2, the entire array is formed in a single well. In an alternative embodiment, as shown in FIG. 8, array 100 can be broken into segments which can be individually accessed via segment select transistors. Each segment, in turn, can be formed in a separate well and, as a result, operated on independently. Thus, for example, one column in a first segment can be programmed at the same time that a separate column in a second segment is being programmed which both can occur at the same time that a row of data is being read from a third segment.

As stated above, one advantage of the present invention is that the memory cells 112 of array 100 can be programmed to store multiple levels by utilizing a programming voltage that is considerably less than the programming voltage typically used, i.e., less than five volts in the present invention compared to the approximately 12 volts that are typically used. In addition to providing a substantial power savings for low power applications, such as notebook computers, the present invention eliminates the need to form charge pumps on memory chips to produce the programming voltage, i.e., the 12 volts.

As is well known, charge pumps can consume a significant area, i.e., up to 30% of the total die area of a memory chip. Thus, by eliminating the need for charge pumps, the present invention significantly reduces the area required for a memory cell, and therefore the cost of a memory.

The elimination of high programming voltages also leads to an increase in the density of array 100 because less isolation is required between both memory cells and the peripheral circuitry. As a result, the present invention substantially reduces the size of array 100.

In another embodiment of the present invention, array 100 can be configured to support both conventional as well as multilevel programming by utilizing a high programming voltage. In this embodiment, the high programming voltage can be provided either externally or on-chip, i.e., via the charge pumps.

As a result, a single memory chip can utilize a first portion of the array to store one bit per cell when the data must be stored quickly, and a second portion of the array to store multiple bits per cell when more time can be taken to store the data.

It should be understood that various alternatives to the embodiment of the invention described herein may be employed in practicing the invention. For example, although the present invention has been described in terms of an n-channel, floating-gate memory cell formed in a p-well, the present invention equally applies to a p-channel, floating-gate memory cell formed in an n-well.

Thus, it is intended that the following claims define the scope of the invention and that methods and structures within the scope of these claims and their equivalents be covered thereby.

What is claimed is:

1. A method for programming a memory array, the array having a plurality of memory cells formed in columns and rows, a plurality of common source bit lines arranged so that two rows of memory cells are formed between each pair of adjacent common source bit lines, a plurality of drain regions formed in columns and rows so that one row of drain regions is formed between each pair of adjacent common source bit lines, and so that, in each column of memory cells, one drain region is formed between each pair of memory cells that are formed between adjacent rows of common source bit lines, a plurality of word lines formed so that one word line is formed over each of the memory cells in a row of memory cells, and a plurality of metal drain lines formed so that one metal drain line contacts each of the drain regions in a column of drain regions, each memory cell being formed to produce a punchthrough current during programming, the array being formed in a well, the method comprising the steps of:

identifying a memory cell in a column of memory cells that is to be programmed from an erased threshold voltage to a first threshold voltage, and a memory cell in the column of memory cells that is to be programmed from the erased threshold voltage to a second threshold voltage;

applying a first voltage to the metal drain line that corresponds to the column of memory cells;

applying a second voltage to the common source bit lines, the second voltage being less than the first voltage;

applying the second voltage to the well; and applying a programming voltage that corresponds to the first threshold voltage to the word line that corresponds to the memory cell in the column of memory cells that is to be programmed to the first threshold voltage, and a programming voltage that corresponds to the second threshold voltage to the word line that corresponds to the memory cell in the column of memory cells that is to be programmed to the second threshold voltage.

2. The method of claim 1 wherein the second voltage is equal to ground.

3. The method of claim 1 wherein the second voltage is less than the first voltage by a difference voltage within the range of two to seven volts.

4. The method of claim 1 and further comprising the steps of:

identifying a memory cell in the column of memory cells that is to be programmed from the erased threshold voltage to a third threshold voltage; and applying a programming voltage that corresponds to the third threshold voltage to the word line that corresponds to the memory cell in the column of memory cells that is to be programmed to the third threshold voltage.

5. The method of claim 4 and further comprising the steps of:

identifying a memory cell in the column of memory cells that is to be programmed from the erased threshold voltage to a fourth threshold voltage; and applying a programming voltage that corresponds to the fourth threshold voltage to the word line that corresponds to the memory cell in the column of memory cells that is to be programmed to the fourth threshold voltage.

6. The method of claim 1 wherein the programming voltage that corresponds to the first threshold voltage and the programming voltage that corresponds to the second threshold voltage are applied simultaneously.

7. The method of claim 6 wherein the programming voltage that corresponds to the first threshold voltage and the programming voltage that corresponds to the second threshold voltage are applied for an equivalent period of time.

8. The method of claim 4 wherein the programming voltage that corresponds to the first threshold voltage, the programming voltage that corresponds to the second threshold voltage, and the programming voltage that corresponds to the third threshold voltage are applied simultaneously.

9. The method of claim 8 wherein the programming voltage that corresponds to the first threshold voltage, the programming voltage that corresponds to the second threshold voltage, and the programming voltage that corresponds to the third threshold voltage are applied for an equivalent period of time.

10. The method of claim 1 wherein the programming voltage that corresponds to the first threshold voltage and the programming voltage that corresponds to the second threshold voltage are less than six volts.

11. The method of claim 4 wherein the programming voltage that corresponds to the first threshold voltage, the programming voltage that corresponds to the second threshold voltage, and the programming voltage that corresponds to the third threshold voltage are less than six volts.

12. The method of claim 5 and further comprising the steps of:

identifying a memory cell in the column of memory cells that is to be programmed from the erased threshold voltage to a fifth threshold voltage; and applying a programming voltage that corresponds to the fifth threshold voltage to the word line that corresponds to the memory cell in the column of memory cells that is to be programmed to the fourth fifth threshold voltage.

13. The method of claim 12 wherein the programming voltage that corresponds to the first threshold voltage, the programming voltage that corresponds to the second threshold voltage, the programming voltage that corresponds to the third threshold voltage, the programming voltage that corresponds to the fourth threshold voltage, and the programming voltage that corresponds to the fifth threshold voltage are applied simultaneously.

14. The method of claim 13 wherein the programming voltage that corresponds to the first threshold voltage, the programming voltage that corresponds to the second threshold voltage, the programming voltage that corresponds to the third threshold voltage, the programming voltage that corresponds to the fourth threshold voltage, and the programming voltage that corresponds to the fifth threshold voltage are applied for an equivalent period of time.

15. A method for programming a plurality of segments of a memory array, at least two of the segments having a plurality of memory cells formed in columns and rows, a plurality of common source bit lines arranged so that two rows of memory cells are formed between each pair of adjacent common source bit lines, a plurality of drain regions formed in columns and rows so that one row of drain regions is formed between each pair of adjacent common source bit lines, and so that, in each column of memory cells, one drain region is formed between each pair of memory cells that are formed between adjacent rows of common source bit lines, a plurality of word lines formed so that one word line is formed over each of the memory cells in a row of memory cells, and a plurality of metal drain lines formed so that one metal drain line contacts each of the drain regions in a column of drain regions, at least one memory cell being formed to produce a punchthrough current during programming, the array being formed in a well, at least two of the segments being formed in a different well, the method comprising the steps of:

identifying a memory cell in a column of memory cells in each segment that is to be programmed from an erased threshold voltage to a first threshold voltage, and a memory cell in the column of memory cells in each segment that is to be programmed from the erased threshold voltage to a second threshold voltage;

applying a first voltage to the metal drain line that corresponds to the column of cells in each segment;

applying a second voltage to the common source bit lines in each segment, the second voltage being less than the first voltage;

applying the second voltage to the well in each segment; and applying a programming voltage that corresponds to the first threshold voltage to the word line that corresponds to the memory cell in the column of memory cells in each segment that is to be programmed to the first threshold voltage, and a programming voltage that corresponds to the second threshold voltage to the word line that corresponds to the memory cell in the column of memory cells in each segment that is to be programmed to the second threshold voltage.

16. The method of claim 15 and further comprising the steps of:

identifying a memory cell in the column of memory cells in each segment that is to be programmed from the erased threshold voltage to a third threshold voltage; and applying a programming voltage that corresponds to the third threshold voltage to the word line that corresponds to the memory cell in the column of memory cells in each segment that is to be programmed to the third threshold voltage.

17. The method of claim 16 and further comprising the steps of:

identifying a memory cell in the column of memory cells in each segment that is to be programmed from the erased threshold voltage to a fourth threshold voltage; and applying a programming voltage that corresponds to the fourth threshold voltage to the word line that corresponds to the memory cell in the column of memory cells in each segment that is to be programmed to the fourth threshold voltage.

18. The method of claim 15 wherein the programming voltage that corresponds to the first threshold voltage and the programming voltage that corresponds to the second threshold voltage are applied simultaneously.

19. The method of claim 15 wherein the programming voltage that corresponds to the first threshold voltage and the programming voltage that corresponds to the second threshold voltage are less than six volts.

20. The method of claim 16 wherein the programming voltage that corresponds to the first threshold voltage, the programming voltage that corresponds to the second threshold voltage, and the programming voltage that corresponds to the third threshold voltage are applied simultaneously.

* * * * *

UNITED STATES PATENT AND TRADEMARK OFFICE
CERTIFICATE OF CORRECTION

PATENT NO. : 5,587,949
DATED : December 24, 1996
INVENTOR(S) : Albert Bergemont, et al It is certified that error appears in the above-indentified patent and that said Letters Patent is hereby corrected as shown below:

Column 10, line 13, delete "fourth".

Signed and Sealed this

Fourth Day of March, 1997

Attest:

BRUCE LEHMAN

*Attesting Officer*  *Commissioner of Patents and Trademarks*